(12) United States Patent
Seki et al.

(10) Patent No.: US 12,406,824 B2
(45) Date of Patent: Sep. 2, 2025

(54) CHARGED PARTICLE BEAM DEVICE AND SAMPLE OBSERVATION METHOD

(71) Applicant: Hitachi High-Tech Corporation, Tokyo (JP)

(72) Inventors: Yusuke Seki, Tokyo (JP); Mitsuhiro Nakamura, Tokyo (JP); Keisuke Tanuma, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 532 days.

(21) Appl. No.: 17/922,823

(22) PCT Filed: Jun. 12, 2020

(86) PCT No.: PCT/JP2020/023151
§ 371 (c)(1),
(2) Date: Nov. 2, 2022

(87) PCT Pub. No.: WO2021/250879
PCT Pub. Date: Dec. 16, 2021

(65) Prior Publication Data
US 2023/0197400 A1    Jun. 22, 2023

(51) Int. Cl.
*H01J 37/21* (2006.01)
*H01J 37/20* (2006.01)
*H01J 37/22* (2006.01)

(52) U.S. Cl.
CPC .............. *H01J 37/20* (2013.01); *H01J 37/22* (2013.01); *H01J 2237/153* (2013.01); *H01J 2237/28* (2013.01)

(58) Field of Classification Search
CPC .. H01J 37/20; H01J 37/22; H01J 37/28; H01J 37/222; H01J 37/244; H01J 2237/221;
(Continued)

(56) References Cited

U.S. PATENT DOCUMENTS 9,552,959 B2   1/2017  Ogura
2006/0091309 A1*  5/2006  Oosaki ............... H01J 37/28
250/310

(Continued)

FOREIGN PATENT DOCUMENTS

JP      53-31990 A     3/1978
JP     2006-153837 A    6/2006
(Continued)

OTHER PUBLICATIONS

International Search Report (PCT/ISA/210) issued in PCT Application No. PCT/JP2020/023151 dated Aug. 25, 2020 with English translation (seven (7) pages).
(Continued)

*Primary Examiner* — Wyatt A Stoffa
*Assistant Examiner* — Hsien C Tsai
(74) *Attorney, Agent, or Firm* — Crowell & Moring LLP

(57) ABSTRACT

A dielectric microscopic observation is possible, which suppresses image flow regardless of scanning speed. There are provided a sample chamber 120 holding a sample 200 between a first insulating layer 121 on which a conductive layer 211 to be irradiated with a charged particle beam is laminated and a second insulating layer 122, an amplifier 141 that amplifies a potential change that occurs at an interface between the first insulating layer and the sample as the conductive layer is irradiated with the charged particle beam, and outputs the amplified result as a measurement signal, a main control unit 142 that converts the measurement signal from the amplifier into image data, and corrects the image data with a deconvolution filter 302 to generate corrected image data, a display unit 144 including an observation image display unit 501 and a filter adjustment unit 502 that displays setting information of the deconvolution filter, and an information processing device that displays the (Continued)

corrected image data on the observation image display unit, and when the setting information of the deconvolution filter displayed in the filter adjustment unit is changed, adjusts the deconvolution filter according to the changed setting information.

12 Claims, 4 Drawing Sheets

(58) Field of Classification Search
CPC ............ H01J 2237/28; H01J 2237/153; H01J 2237/2003; H01J 2237/2004; H01J 2237/2007; H01J 2237/2008; H01J 2237/2608; H01J 2237/2801; H01J 2237/24564

See application file for complete search history.

(56) References Cited

U.S. PATENT DOCUMENTS

| | | | |
|---|---|---|---|
| 2012/0126117 A1 | 5/2012 | Nakahira et al. | |
| 2012/0307038 A1 | 12/2012 | Hoshino et al. | |
| 2016/0056012 A1* | 2/2016 | Ogura | H01J 37/244 |
| | | | 250/307 |
| 2019/0362189 A1 | 11/2019 | Uematsu | |
| 2020/0126754 A1 | 4/2020 | Numata et al. | |
| 2021/0270758 A1 | 9/2021 | Ogura | |
| 2022/0044906 A1 | 2/2022 | Nakamura et al. | |

FOREIGN PATENT DOCUMENTS

| | | | |
|---|---|---|---|
| JP | 2011-165450 A | 8/2011 | |
| JP | 2012-142299 A | 7/2012 | |
| JP | 2014-203733 A | 10/2014 | |
| JP | 2016-72184 A | 5/2016 | |
| JP | 2019-204757 A | 11/2019 | |
| WO | WO 2018/193605 A1 | 10/2018 | |
| WO | WO 2019/244468 A1 | 12/2019 | |
| WO | WO 2020/084729 A1 | 4/2020 | |

OTHER PUBLICATIONS

Japanese-language Written Opinion (PCT/ISA/237) issued in PCT Application No. PCT/JP2020/023151 dated Aug. 25, 2020 (four (4) pages).

Japanese-language International Preliminary Report on Patentability (PCT/IPEA/409) issued in PCT Application No. PCT/JP2020/023151 dated Sep. 13, 2021, including Annexes (11 pages).

* cited by examiner

[FIG. 1]
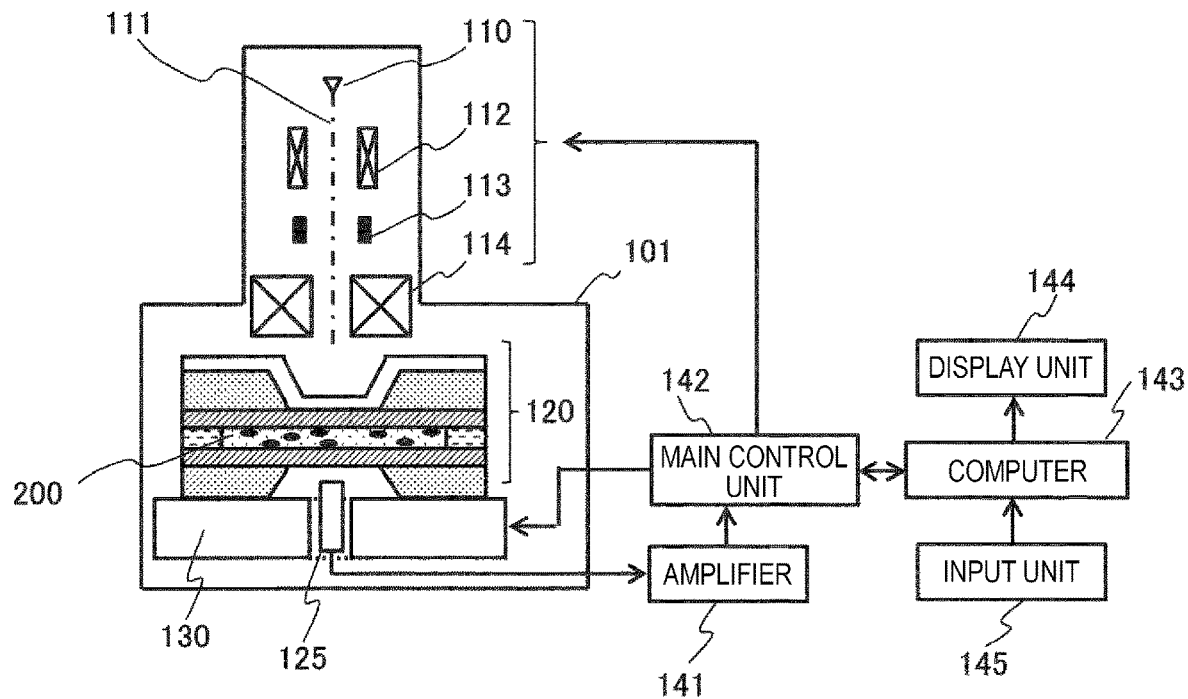
[FIG. 2]
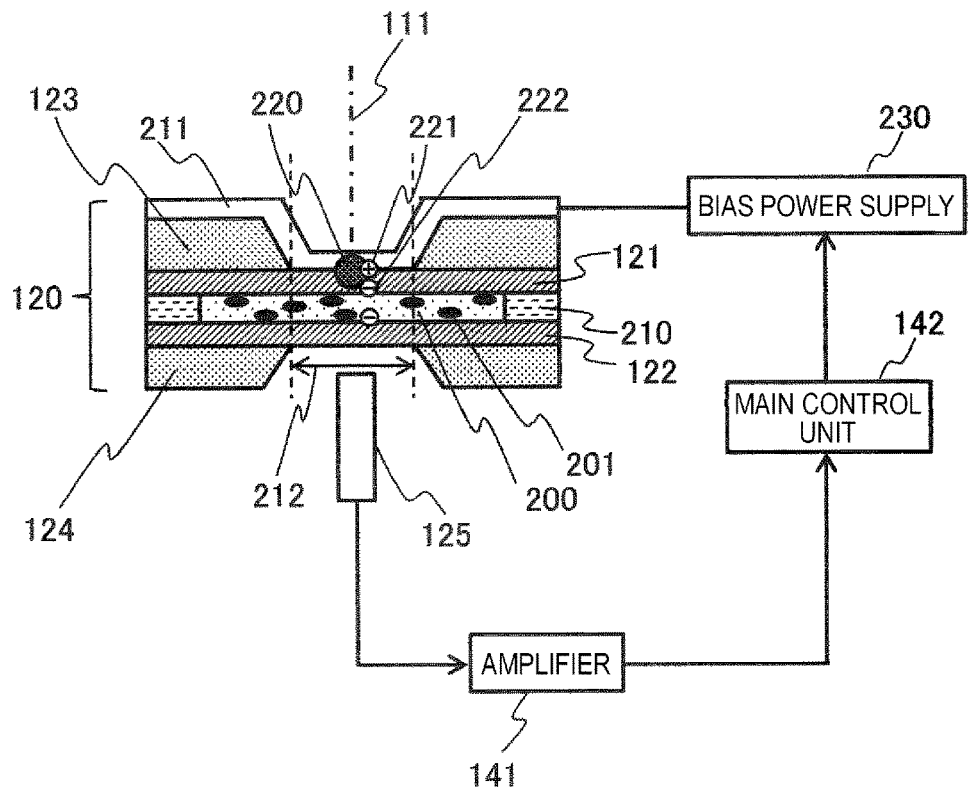

[FIG. 3]
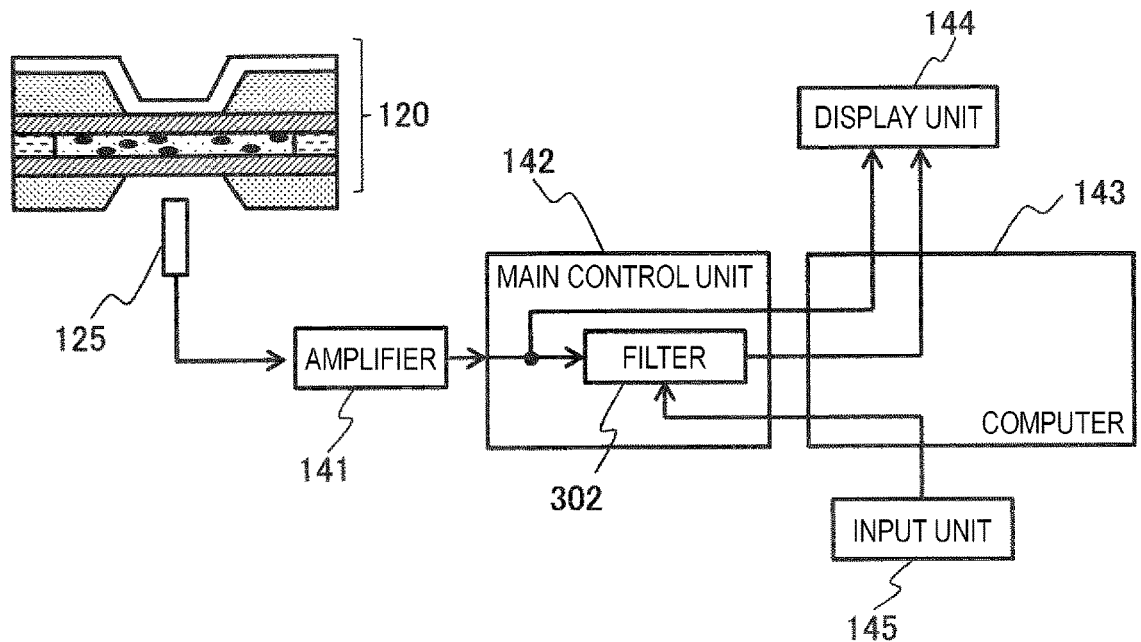
[FIG. 4]
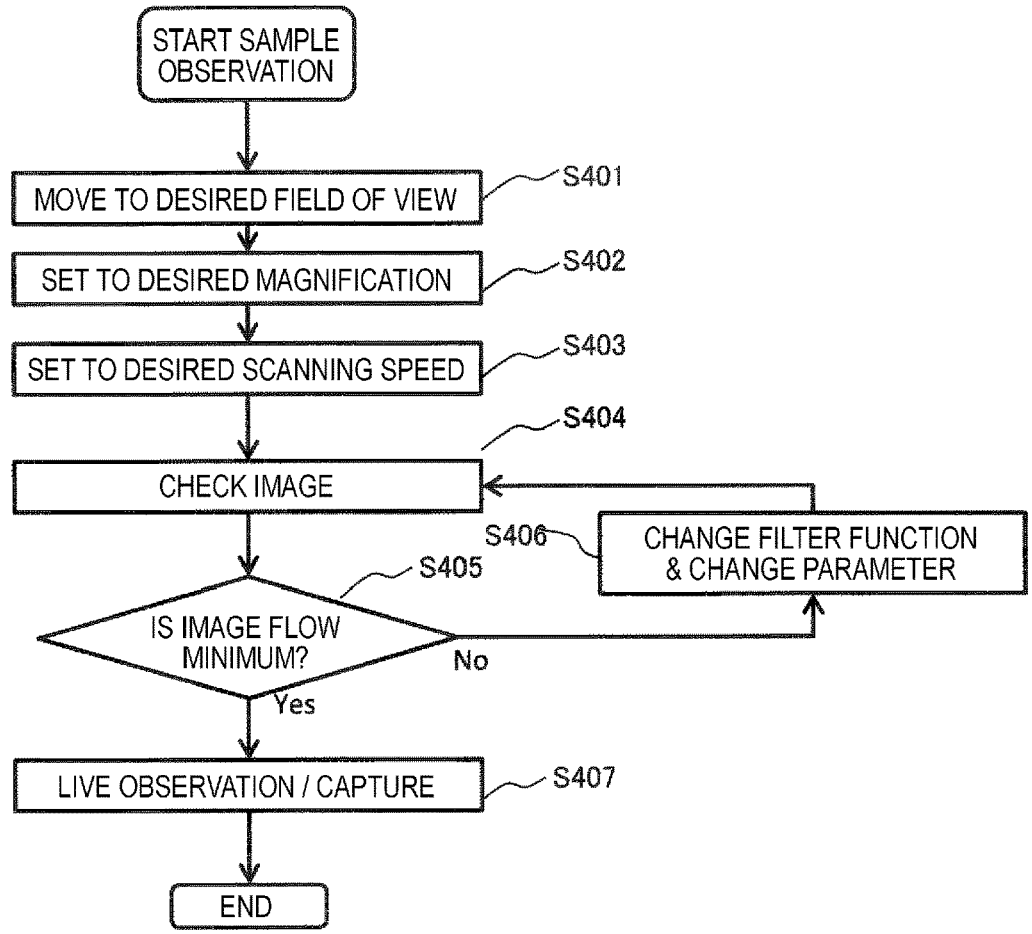

[FIG. 5]
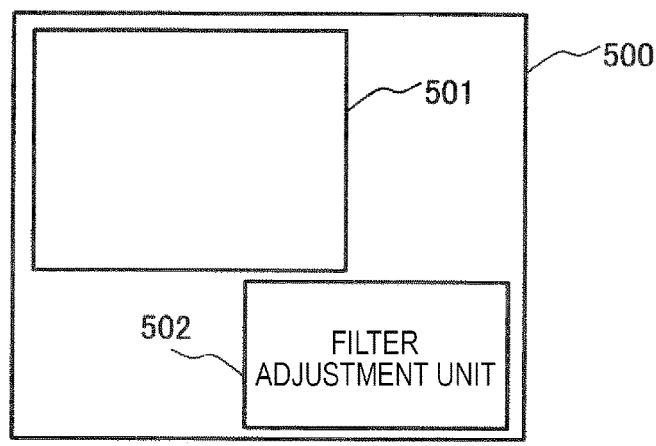
[FIG. 6]
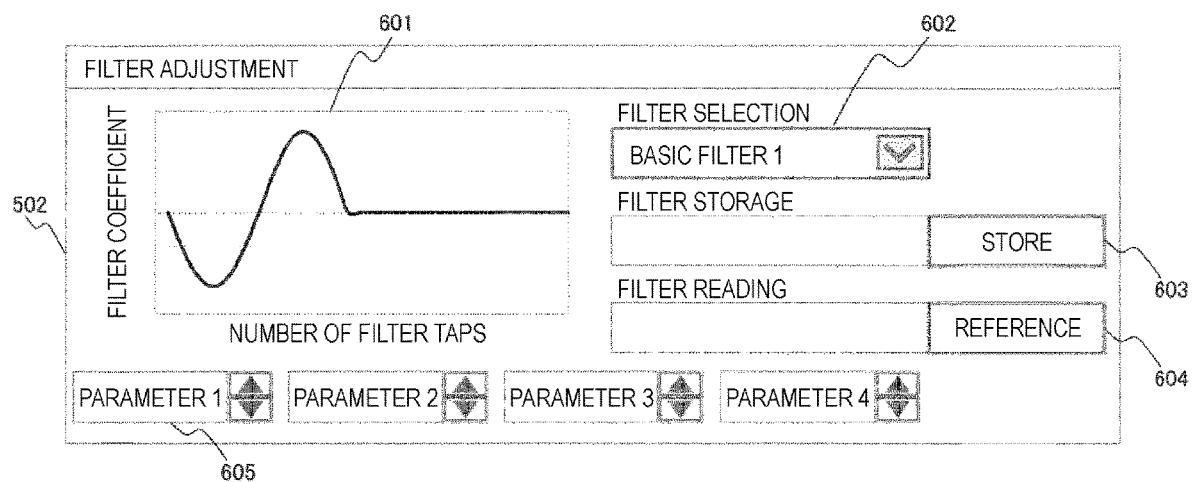

[FIG. 7]
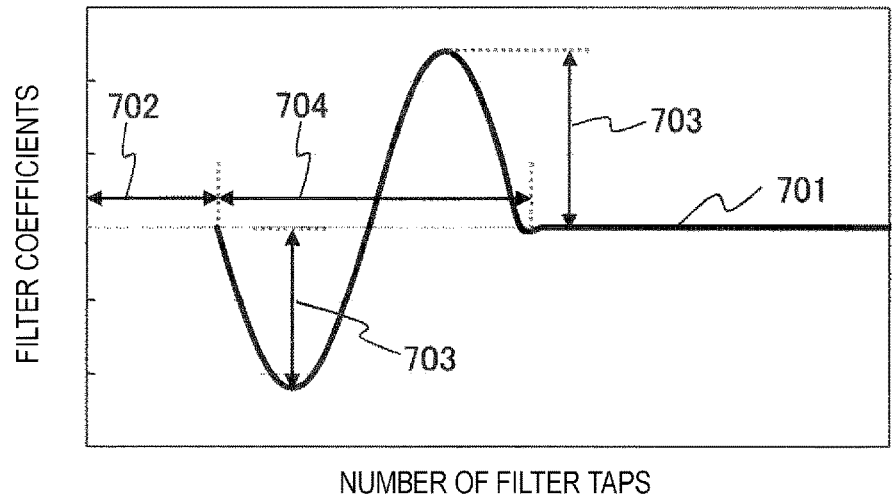
[FIG. 8]
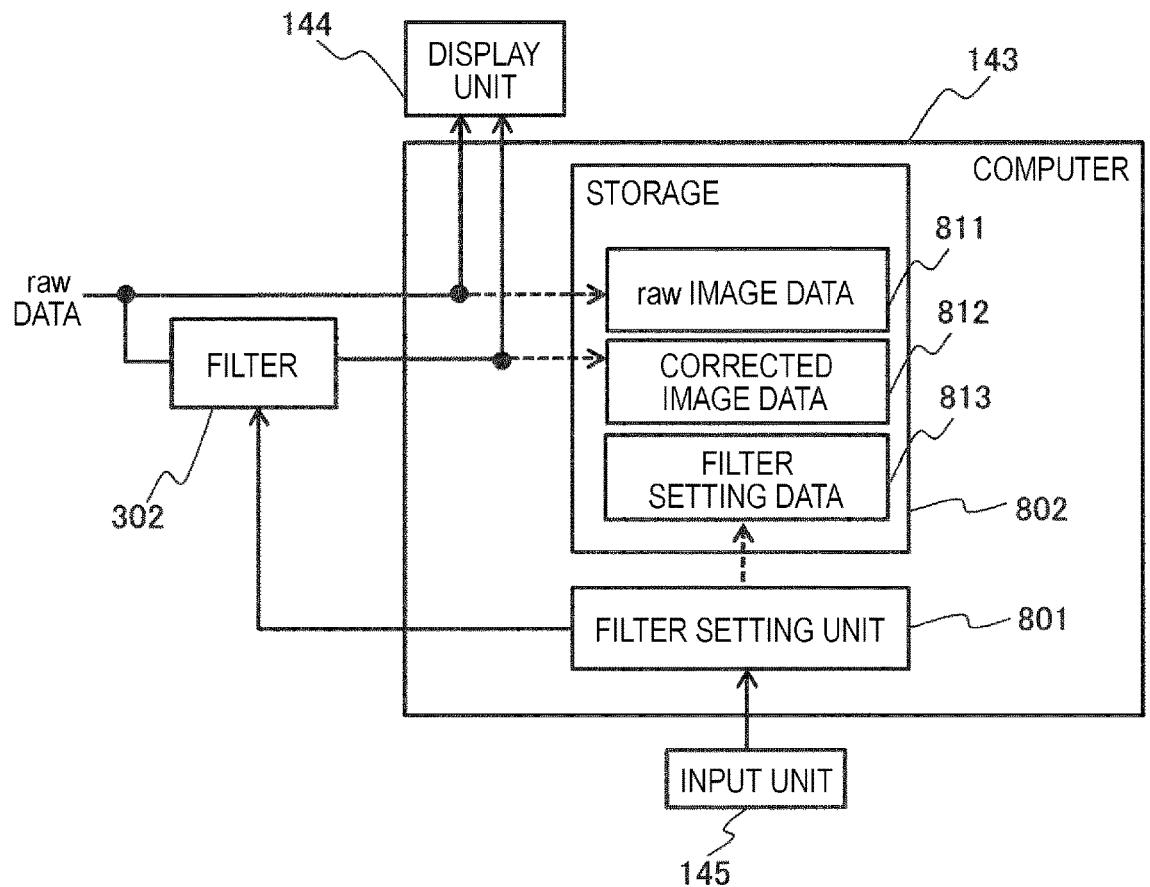

CHARGED PARTICLE BEAM DEVICE AND SAMPLE OBSERVATION METHOD

TECHNICAL FIELD

The present disclosure relates to a charged particle beam device and a sample observation method. More specifically, the present disclosure relates to a charged particle beam device capable of dielectric microscopic observation and also capable of observing a living biological sample, and a sample observation method using the same.

BACKGROUND ART

Scanning electron microscope (SEM), which is one type of charged particle beam device, is in increasing demand as a tool for observing with high resolution not only the material samples such as metals, ceramics, and the like, but also the biological samples. WO-A-2020/084729 (PTL 1) discloses a charged particle beam device that enables a dielectric microscopy capable of non-invasive observation on a living biological sample in an aqueous solution for example, without staining or immobilizing the biological sample.

Meanwhile, it is known that when a charged particle beam is scanned at high speed in a charged particle beam device, the detection signal may deteriorate due to the frequency band limitation of the signal detection system. Specifically, scanning an electron beam at high speed when the response speed of the detector is slow results in an image flow in the scanning direction, which blurs image and makes observation impossible. Therefore, in JP-A-2011-165450 (PTL 2), by performing a correction with a one-dimensional correction filter that is calculated from the deterioration function of the image obtained by scanning at a speed exceeding the bandwidth of the detection system, the image deterioration is corrected without lowering the throughput, thereby enabling real-time observation.

CITATION LIST

Patent Literature

PTL 1: WO-A-2020/084729
PTL 2: JP-A-2011-165450

SUMMARY OF INVENTION

Technical Problem

The dielectric microscopy disclosed in PTL 1 is expected to meet the needs of real-time observation of changes in living biological samples. However, the dielectric microscopy requires an amplifier circuit with a high amplification factor because the signal obtained is very small due to the principle of signal detection. In general, since there is a trade-off between the amplification factor and frequency characteristics of an amplifier, the slow scanning of the charged particle beam for acquiring an image enables acquisition of a high-resolution image, while the fast scanning of the charged particle beam results in the image flows, which makes observation impossible. For this reason, also in dielectric microscopic observation, when observation at a high scanning speed such as a search for an observation field of view, or observation of a temporal change in a biological sample such as a cell is required, since the scanning speed of the charged particle beam often exceeds the bandwidth of the amplifier, image correction process is required.

The charged particle beam device of PTL 2 detects electrons emitted by irradiating a sample with a charged particle beam. In the case of such a detector, the deterioration function of the image is determined by the relationship between the scanning speed of the charged particle beam and the response speed of the detector (including the amplifier). For this reason, the one-dimensional correction filter is prepared in advance according to a combination of the scanning speed of the charged particle beam used for observation and the response characteristic of the detector, and by selecting the one-dimensional correction filter according to the observation conditions and setting the weights, the user can easily achieve appropriate image deterioration correction.

However, in the case of dielectric microscopy, image deterioration is affected by the state of a sample chamber holding the sample or the state of the sample, and furthermore, when the object to be observed is a biological sample in particular, it was clarified that it is also affected by the change over time of the sample during observation.

An object of the present disclosure is to enable observation while suppressing image flow regardless of the scanning speed of a charged particle beam in the dielectric microscopic observation.

Solution to Problem

A charged particle beam device of an embodiment of the present disclosure includes a charged particle optical system, a stage, a sample chamber including a conductive layer to be irradiated with a charged particle beam from the charged particle optical system, a first insulating layer laminated with the conductive layer, and a second insulating layer facing the first insulating layer, the sample chamber being mounted on the stage and configured to hold a sample between the first insulating layer and the second insulating layer, an amplifier that amplifies a potential change that occurs at an interface between the first insulating layer and the sample as the conductive layer of the sample chamber is irradiated with the charged particle beam, and outputs the amplified result as a measurement signal, a main control unit that controls the charged particle optical system and the stage, and that also converts the measurement signal from the amplifier into image data and corrects the image data with a deconvolution filter to generate corrected image data, an information processing device, and a display unit including an observation image display unit and a filter adjustment unit that displays setting information of the deconvolution filter used in the main control unit, in which the information processing device displays the corrected image data on the observation image display unit, and when the setting information of the deconvolution filter displayed in the filter adjustment unit is changed, adjusts the deconvolution filter used in the main control unit according to the changed setting information.

Advantageous Effects of Invention

Regardless of the scanning speed, it is possible to obtain an observation image with suppressed image flow. As a result, it is possible to speed up the search of the observation field of view and to easily perform real-time observation following changes in the sample.

Other issues and novel features will become apparent from the description of the present specification and the accompanying drawings.

BRIEF DESCRIPTION OF DRAWINGS

FIG. 1 is a configuration diagram illustrating an example of a charged particle beam device.

FIG. 2 is a diagram illustrating a structure of a sample chamber and a principle of dielectric microscopy.

FIG. 3 illustrates a functional block displaying a measurement signal as an image on a display unit.

FIG. 4 is a flow chart for performing a dielectric microscopic observation while correcting image flow.

FIG. 5 illustrates an example of a filter setting screen, which is a user interface for setting filters.

FIG. 6 illustrates an example of a display of a filter adjustment unit.

FIG. 7 illustrates an example of a basic filter function and an example of adjustable parameters.

FIG. 8 is a diagram illustrating an example of a method of storing acquired image data.

DESCRIPTION OF EMBODIMENTS

Hereinafter, embodiments of the present disclosure will be described with reference to the drawings.

FIG. 1 is a configuration diagram illustrating an example of a charged particle beam device for performing dielectric microscopic observation according to the present embodiment. SEM is illustrated as an example of the charged particle beam device. A housing 101 of the charged particle beam device is provided with, as main components, an electron optical system that irradiates a sample 200 to be observed with an electron beam, a stage 130 capable of moving three-dimensionally and on which a sample chamber 120 holding the sample 200 is mounted, and the like. The electron optical system includes an electron gun 110, a condenser lens 112 and an objective lens 114 for converging an electron beam 111 emitted from the electron gun 110 and irradiating the sample with it as a minute spot, and a deflector 113 that scans the electron beam 111 two-dimensionally. Since the sample 200 is a fluid type such as liquid or gel, it is mounted on the stage 130 in a state of being held by the sample chamber 120. Each optical element and stage 130 in the electron optical system are controlled by a main control unit 142.

The structure of the sample chamber 120 and the principle of dielectric microscopic observation will be described below with reference to FIG. 2, and a current flows through an electrode 125 as the electron beam 111 is irradiated toward the sample 200. The current flowing through the electrode 125 is amplified by an amplifier 141 and input to the main control unit 142 as a measurement signal. For each emitted position of the electron beam 111 in the sample chamber 120, the main control unit 142 converts the measurement signal output from the amplifier 141 into pixel gradation data corresponding to the intensity thereof, and outputs the result to a computer (information processing device) 143 as image data each time one frame scan is completed, one line scan is completed, or one pixel scan is completed, according to the deflection speed of the electron beam. The computer 143 displays the image data on a display unit 144. An input unit 145 is connected to the computer 143, and when a user inputs settings and instructions for the charged particle beam device, the computer 143 issues commands to the main control unit 142 according to the input.

The structure of the sample chamber 120 and the principle of dielectric microscopy will be described with reference to FIG. 2. The sample chamber 120 illustrated in cross section in FIG. 2 holds the sample 200 by having the sample 200 interposed between a first insulating layer 121 and a second insulating layer 122. The first insulating layer 121 is arranged on a side irradiated with the electron beam 111 and serves to isolate the sample 200 from the vacuum inside the housing 101 of the charged particle beam device. The first insulating layer 121 and the second insulating layer 122 are supported by an outer frame portion 123 and an outer frame portion 124 to maintain strength, respectively. In addition, the outer frame portion 123 and the outer frame portion 124 are provided with windows at positions facing each other, and the insulating layer is not supported by the outer frame portion at the bottom of the windows. Furthermore, a conductive layer 211 is provided on the side irradiated with the electron beam 111 so as to cover the first insulating layer 121 and the outer frame portion 123. The bottom of the window of the outer frame in the sample chamber 120 is an observation area 212 of the sample 200. In the observation area 212, the conductive layer 211 is irradiated with the electron beam 111, so that the current flowing through the electrode 125 disposed close to the second insulating layer 122 is detected.

The inside of the housing 101 of the charged particle beam device through which the electron beam passes needs to be in a vacuum state, but the sample 200 containing the liquid cannot be exposed to vacuum. Therefore, in the example of FIG. 2, an intermediate layer 210 is provided to isolate the sample 200 held between the first insulating layer 121 and the second insulating layer 122 from the vacuum. Note that the intermediate layer 210 is not necessarily provided in the sample chamber 120 if the sample 200 is isolated from the vacuum. For example, when the intermediate layer 210 is not provided, the sample 200 may be isolated from vacuum by maintaining the surroundings of the sample 200 at an atmospheric pressure or at a degree of vacuum lower than that of the housing 101 with a vacuum partition (not illustrated). However, in order to allow the electron beam 111 to be emitted to the conductive layer 211 of the sample chamber 120, an upper surface of the vacuum partition (the side irradiated with the electron beam 111) needs to be open at a portion that faces the observation area 212.

As described above, in the observation area 212, the second insulating layer 122 is exposed to the external atmosphere, and the electrode 125 is disposed in the vicinity thereof. Note that the external atmosphere to which the second insulating layer 122 is exposed in the observation area 212 may be the same vacuum atmosphere as the housing 101, or may be atmospheric pressure or a degree of vacuum lower than that of the housing 101. Any of the above is possible, depending on a method of isolating the sample 200 from the vacuum.

The sample chamber 120 has a mechanism for generating an electric field on the sample 200. Specifically, a bias power supply 230 is provided, which applies a bias voltage to the conductive layer 211. Meanwhile, the opposing electrode 125 is applied with a reference potential with respect to the bias voltage. In addition, the electrode 125 is electrically insulated from the stage 130.

Next, the principle of dielectric microscopy will be described. In the dielectric microscopic observation of the present embodiment, it is preferable that the acceleration voltage of the electron beam 111 is set so as not to pass through the first insulating layer 121 substantially. When the sample chamber 120 is irradiated with the electron beam 111, positive carriers 221 and negative carriers 222 are generated in an electron beam scattering area 220 inside the first insulating layer 121. The bias voltage described above causes the positive carriers 221 to move toward the conductive layer 211 and the negative carriers 222 toward the sample 200. When the liquid of the sample 200 is water, since the water molecules themselves are polarized, the interface between the first insulating layer 121 and the sample 200 is negatively charged, so that the electric dipoles of the water molecules are arranged along the potential gradient. Due to this electric dipole arrangement, charges are also generated in the opposing second insulating layer 122. A potential signal generated in the second insulating layer 122 by this charge is detected by the electrode 125.

In this example, the sample 200 includes cells 201 that can be regarded as protein complexes dispersed in water, and attention is paid to a two-dimensional electric field intensity distribution first insulating layer 121 along the interface between the first insulating layer 121 and the sample 200 in the observation area 212. In an area where the cells 201 are attached in the vicinity of the interface between the sample 200 and the first insulating layer 121, the electric field intensity in the cells increases, and accordingly, the electric field intensity in the first insulating layer 121 just above the interface is relatively low. On the other hand, in an area where there are no cells in the vicinity of the interface between the sample 200 and the first insulating layer 121, the electric field intensity in the first insulating layer 121 just above the interface is relatively high. Thus, the two-dimensional electric field intensity distribution along the interface with the sample 200 in the first insulating layer 121 in the observation area 212 reflects the dielectric distribution in the sample 200. Specifically, because the dielectric constant of water is about 80 while the dielectric constant of protein is 2 to 3, the potential gradient, that is, the electric field intensity in the water portion is gentler than that in the cell portion.

In summary, due to the two-dimensional electric field intensity distribution along the interface with the sample 200 in the first insulating layer 121, the mobility of the positive carriers 221 and negative carriers 222 generated in the electron beam scattering area 220 in the first insulating layer 121 is changed, thereby changing the charge amount of the second insulating layer 122. By detecting the magnitude of the potential signal generated in the second insulating layer 122, the dielectric constant of the sample 200 at the emitted position of the electron beam 111 can be detected. By scanning the electron beam 111, the electric current flowing through the electrode 125 is changed according to the dielectric distribution of the sample 200, and this change is imaged as contrast.

In addition, the thicknesses of the first insulating layer 121 and the conductive layer 211 are made uniform. Therefore, the depth of the scattering area 220 of the incident electron beam 111 is uniform regardless of the scanning area, and the energy distribution of the primary electrons in the scattering area 220 is also uniform regardless of the scanning area. As a result, the number of the positive carriers 221 and negative carriers 222 generated in the first insulating layer 121 can also be made uniform regardless of the scanning area.

FIG. 3 illustrates a functional block for displaying the measurement signal from the amplifier 141 as an image on the display unit 144. The amplifier 141 amplifies the current detected by the electrode 125, converts it into a voltage signal, and outputs it to the main control unit 142 as a measurement signal. The main control unit 142 converts the voltage signal input from the amplifier 141 into pixel gradation data according to its intensity. As described above, the converted pixel gradation data (image data) is output to the computer 143 and displayed on the display unit 144. Further, the main control unit 142 has a filter 302. The filter 302 is a filter that performs deconvolution on the pixel gradation data to correct image flow when image flow occurs in the acquired image data.

As described above, since the secondary signal detector disclosed in PTL 2 detects signal electrons emitted from the sample into the vacuum space, the sample to be observed and the holding structure of the sample do not affect the image deterioration. On the other hand, in the dielectric microscopy of the present embodiment, as described with reference to FIG. 2, since the electric field generated in the first insulating layer 121 is propagated to the second insulating layer 122 by the arrangement of the electric dipoles of the water molecules contained in the sample and the potential change occurring in the second insulating layer 122 is detected with the electrode 125, the structure of the sample chamber 120 and the state of the sample 200 also affect the detection speed of the detection system.

For example, the sample chamber 120 is formed by assembling a laminate including the first insulating layer 121 and a laminate including the second insulating layer 122 with the sample 200 interposed therebetween. Therefore, the thickness of the sample 200, that is, the distance between the first insulating layer 121 and the second insulating layer 122 changes according to the amount of the interposed sample 200. Even when the same sample is observed at the same scanning speed, if the thickness of the sample is different, the speed of current change occurring in the electrode 125 is different. In addition, in the observation area 212 of the sample chamber 120, since the sample 200 is held only by the upper and lower thin films, the thin film layer holding the sample 200 may bend during the process of vacuuming the housing 101.

Moreover, the state of the sample 200 also affects the detection speed. For example, when it is assumed that the sample 200 is the cells 201 dispersed in water, the speed of current change occurring at the electrode 125 differs according to the concentration and distribution of the cells 201. Furthermore, since the sample 200 has fluidity, the speed of the current change occurring on the electrode 125 also varies due to changes over time such as movement of the cells 201 in the sample 200 during observation.

As described above, even with the circuit characteristics of the amplifier 141 itself remaining unchanged for each observation, the response characteristics of the detection system including the sample chamber 120 differ for each observation under the influence of the assembly of the sample chamber 120, the characteristics of the sample chamber 120 such as the deflection of the thin film layer due to the pressure difference, the state of the sample such as the concentration of the sample 200, and the change over time of the state of the sample during observation. Therefore, it is not possible to select a filter that performs appropriate correction process only from numerical parameters such as the scanning speed of the charged particle beam and the circuit characteristics of the amplifier 141.

Therefore, in the present embodiment, it is configured such that a filter function used as the filter 302 and its parameters can be set by the user through the input unit 145. For example, if image flow occurs in the image displayed on the display unit 144 based on the measurement signal from the amplifier 141, the user can adjust the filter 302 through a predetermined user interface. As a result, by adjusting the filter 302 each time and while checking the image displayed on the display unit 144, the user can observe images without having image flow regardless of the scanning speed of the charged particle beam or the change over time of the sample. In addition, since the filter 302 can be adjusted at any timing, it is also possible to observe in real time how a living biological sample changes, for example.

FIG. 4 illustrates a flow chart for performing a dielectric microscopic observation while correcting image flow by using the charged particle beam device according to the present embodiment. As the operation starts, the user moves to the field of view of the sample to be observed using the user interface or the input unit 145 (S401), sets the magnification (S402) and sets the scanning speed (S403), and confirms the obtained image (S404). At this time, the user checks an amount of image flow (S405), and if it is determined that the amount of image flow is not the minimum amount, the user selects an appropriate filter function and adjusts the parameters through the user interface (S406). Since the image whose image flow was corrected by the filter 302 (deconvolution filter) is displayed on the display unit, an appropriate filter can be set by selecting a filter function and adjusting parameters (S406) while observing the corrected image. As a result, the search for an observation field of view can be performed at high speed, and even when the state of the sample changes rapidly, such changes can be followed and the observation can be continued. Image capturing or live observation is performed in a state in which image flow is minimized by the correction (S407). The image capturing may be either capturing of a still image or capturing of a moving image.

Note that the order of performing the operations S401, S402, and S403 is random. Changing any of the conditions results in a change of the appropriate filter. This is because, as described above, changing the scanning speed of the charged particle beam leads into a change in the deterioration state of the image, and further, since the state of a fluid sample is generally not uniform, when the scanning range is varied, the state of the sample is also varied, and so the deterioration state of the image also changes.

FIG. 5 illustrates a user interface for setting filters. A filter setting screen 500 displayed on the display unit 144 includes an SEM image display unit 501 and a filter adjustment unit 502. The SEM images before and after correction process by the filter 302 can be displayed on the SEM image display unit 501. Note that after the filter adjustment, the display may be switched to display only the SEM image after the filter correction process. If image flow is observed in the SEM image displayed on the SEM image display unit 501, the user can select a filter function and adjust parameters in the filter adjustment unit 502 of the setting screen 500 to correct the image flow. By performing the correction while observing the SEM image, it is possible to obtain a good image with the dielectric microscopy having many factors of changes in the amount of image flow.

FIG. 6 illustrates an example of a display of the filter adjustment unit 502. The filter adjustment unit 502 includes a filter function display unit 601 that displays a filter function, a filter selection unit 602 that selects a basic filter function to be applied from a plurality of basic filter functions stored in advance, a filter storage unit 603 that stores the current filter, a filter reference unit 604 that reads the stored filter, and a parameter adjustment unit 605 that adjusts the parameters of the selected basic filter function or the read filter. In the present embodiment, since the deconvolution filter used for correction can be set by the filter function and its parameters, these are referred to as the filter setting information. The filter storage unit 603 enables the user to store the filter setting information adjusted in actual observation such that, when repeating the observation on the same sample, it is expected that the parameter adjustment is facilitated compared to setting the filter by adjusting with the basic filter function. The parameter adjustment unit 605 can adjust at least one parameter for the filter (function) to be adjusted. The number of adjustable parameters may vary according to the basic filter function selected. By selecting a basic filter function with a small number of adjustable parameters, the filter can be adjusted more easily, and by selecting a basic filter function with a large number of adjustable parameters, the filter can be adjusted with higher precision.

Further, during observation of the sample, the setting information on the filter used for obtaining the image displayed on the SEM image display unit 501 is displayed on the filter adjustment unit 502. As a result, the user can check at a glance the obtained observation image and the setting information on the filter used at that time. The user can change the setting information on the filter at any timing, and thus can confirm the corrected image as corrected by the adjusted filter on the SEM image display unit 501.

The relationship between taps of the filter and filter coefficient given to each tap is called a filter function. In the present embodiment, some filters for performing deconvolution, which is known as an image sharpening method, are registered in advance as the basic filter functions, and one of the basic filter functions is selected and its parameters are adjusted to set a filter that reduces image flow. FIG. 7 illustrates an example of the basic filter function and an example of adjustable parameters. A basic filter function 701 is not limited to the sine wave illustrated in FIG. 7, and accordingly, it may be a rectangular wave, a triangular wave, a trapezoidal wave, or the like, and the number of waves may be one or more. In addition, the adjustable parameters include starting point offset 702, wave amplitude 703, and wave width 704. For example, although the wave width 704 is adjustable for one wavelength in this example, one wave may be divided and adjusted for every half-wavelength, for example. Note that since these parameters are not necessarily independent, and there are conditions that the filter function must satisfy in order to serve as a deconvolution filter, by adjusting any parameter by the user, the values of other parameters can also be adjusted. For example, when the user adjusts width parameter 704, the filter function is recalculated, so that amplitude parameter 703 is also adjusted to a value corresponding to the adjusted width parameter 704.

FIG. 8 illustrates an example of a method of storing acquired image data. As described above, the user can select a filter function, call a filter from the filter adjustment unit 502, and adjust the parameters. A filter setting unit 801 sets the filter 302 according to the information input by the user through the input unit 145 so as to obtain a desired filter. For example, the filter 302 is implemented as a digital filter realized by FPGA, and the filter coefficient of each tap is set by the filter setting data from the filter setting unit 801. When determining from the corrected image displayed on the display unit 144 that the image flow is suppressed, the user stores the image in a storage 802. At this time, the storage 802 stores image data 811 (referred to as raw image data) before correction by the filter 302, corrected image data 812 corrected by the filter 302, and filter setting data 813 used for setting the filter 302 by the filter setting unit 801 in association with each other. Either one of the raw image data 811 and the corrected image data 812 may be stored.

As a result, in live observation, in order to shorten the time required for observation, an observation method is possible, in which the image of the sample is corrected to the extent that it can be visually recognized on the display unit 144, and the SEM image is improved in accuracy by post-processing.

When capturing a moving image, the raw moving image data, the corrected moving image data, and the filter setting data time-synchronized with the moving image data (either moving image data before or after correction) are stored in association with each other. Also in this case, either one of the raw moving image data and the corrected moving image data may be stored. The timing of time-synchronization may be every fixed time or every any timing set by the user. For the observation on a sample that changes over time in a short period of time, it is possible to follow changes in the state of the sample by accelerating the acquisition cycle of the filter setting data.

Although an example in which the filter setting data 813 is stored in association with the image is illustrated herein, the filter setting information may also be used. That is, it will suffice if the filter information stored in association with the image data is able to reproduce the filter applied to the corrected image. This is the same when storing the filter setting information described with reference to FIG. 6, and in the present embodiment, although an example of storing filter setting information has been illustrated, the corresponding filter setting data may be stored instead. In addition, the method of associating with the image data is arbitrary, and it is also possible to attach and store it under the file name of the image or moving image data.

As described above, the present disclosure has been described with reference to the embodiments, but the present disclosure is not limited to the contents disclosed as the embodiments. For example, the structure of the sample chamber and the principle of the dielectric microscopy have been described with reference to FIG. 2, but the configuration of the detection system illustrated in FIG. 2 is merely one configuration example of the dielectric microscopy. For example, PTL 1 illustrates a plurality of configuration examples of the detection system, and the present disclosure can be applied regardless of the configuration of the detection system, as long as it uses a sample chamber including a conductive layer irradiated with a charged particle beam from the charged particle optical system, a first insulating layer laminated with the conductive layer, and a second insulating layer facing the first insulating layer, and holding the sample between the first insulating layer and the second insulating layer, and has a detection system that amplifies and detects a potential change that occurs at the interface between the first insulating layer and the sample when the conductive layer of the sample chamber is irradiated with the charged particle beam.

REFERENCE SIGNS LIST

101: housing
110: electron gun
111: electron beam
112: condenser lens
113: deflector
114: objective lens
120: sample chamber
121: first insulating layer
122: second insulating layer
123, 124: outer frame portion
125: electrode
130: stage
141: amplifier
142: main control unit
143: computer
144: display unit
145: input unit
200: sample
201: cells
210: intermediate layer
211: conductive layer
212: observation area
220: electron beam scattering area
221: positive carrier
222: negative carrier
230: bias power supply
302: filter
500: filter setting screen
501: SEM image display unit
502: filter adjustment unit
601: filter function display unit
602: filter selection unit
603: filter storage unit
604: filter reference unit
605: parameter adjustment unit
701: basic filter function
702: start point offset parameter
703: amplitude parameter
704: width parameter
801: filter setting unit
802: storage
811: raw image data
812: corrected image data
813: filter setting data.

The invention claimed is:

1. A charged particle beam device comprising:
a charged particle optical system;
a stage;
a sample chamber including a conductive layer to be irradiated with a charged particle beam from the charged particle optical system, a first insulating layer laminated with the conductive layer, and a second insulating layer facing the first insulating layer, the sample chamber being mounted on the stage and configured to hold a sample between the first insulating layer and the second insulating layer;
an amplifier that amplifies a potential change that occurs at an interface between the first insulating layer and the sample as the conductive layer of the sample chamber is irradiated with the charged particle beam, and outputs the amplified result as a measurement signal;
a main control unit that controls the charged particle optical system and the stage, and that also converts the measurement signal from the amplifier into image data and corrects the image data with a deconvolution filter to generate corrected image data;
a display unit including an observation image display unit and a filter adjustment unit that displays setting information of the deconvolution filter used in the main control unit; and
an information processing device that displays the corrected image data on the observation image display unit, and when the setting information of the deconvolution filter displayed in the filter adjustment unit is changed, adjusts the deconvolution filter used in the main control unit according to the changed setting information, wherein the information processing device registers a plurality of filter functions that are relationships between taps of the filter and filter coefficients given to each tap, and generates filter setting data as one of the filter functions is selected in the filter adjustment unit, and parameters of the selected filter function are adjusted, and the main control unit sets the deconvolution filter for correcting the image data based on the filter setting data.

2. The charged particle beam device according to claim 1, wherein, when the deconvolution filter used in the main control unit is adjusted, the corrected image data corrected by the adjusted deconvolution filter is displayed on the observation image display unit.

3. The charged particle beam device according to claim 1, comprising:

an electrode arranged in a vicinity of the second insulating layer of the sample chamber; and a bias power supply that applies a predetermined bias voltage to the conductive layer of the sample chamber with the electrode serving as a reference potential, wherein the amplifier amplifies a current that flows through the electrode as the conductive layer of the sample chamber is irradiated with the charged particle beam, converts the amplified result into a voltage signal and outputs the converted result as the measurement signal.

4. The charged particle beam device according to claim 1, wherein the information processing device stores information on the deconvolution filter of which the parameters were adjusted by the information processing device.

5. The charged particle beam device according to claim 4, wherein the information processing device reads the stored information on the deconvolution filter and adjusts the parameters to generate new filter setting data, and the main control unit sets the deconvolution filter for correcting the image data based on the new filter setting data.

6. The charged particle beam device according to claim 1, the information processing device stores, in association with each other, the image data and/or the corrected image data and the information on the deconvolution filter used in the main control unit when acquiring the image data.

7. The charged particle beam device according to claim 6, wherein the image data is moving image data, and the corrected image data is corrected moving image data, and the information processing device stores, in association with each other, the moving image data and/or the corrected moving image data and information on a deconvolution filter used in the main control unit when acquiring the moving image data, which is time-synchronized with the moving image data or the corrected moving image data.

8. A sample observation method using a charged particle beam device having a charged particle optical system and a stage, the sample observation method comprising:

placing, on the stage, a sample chamber including a conductive layer, a first insulating layer laminated with the conductive layer, and a second insulating layer facing the first insulating layer, the sample chamber being configured to hold a sample between the first insulating layer and the second insulating layer;

scanning a charged particle beam from the charged particle optical system over the conductive layer of the sample chamber, and amplifying, by an amplifier, a potential change that occurs at an interface between the first insulating layer and the sample as the conductive layer is irradiated with the charged particle beam and outputting the amplified result as a measurement signal;

converting the measurement signal from the amplifier into image data;

correcting the image data with a deconvolution filter to generate corrected image data;

displaying, on a display unit, the image data or the corrected image data as an observation image and setting information on the deconvolution filter used for the observation image; and changing the setting information on the deconvolution filter of the display unit to adjust the deconvolution filter used for generating the corrected image data, wherein the setting information of the deconvolution filter that is displayed on the display unit and changeable includes a filter function that is the relationship between taps of the filter and filter coefficients given to each tap, and parameters of the filter function.

9. The sample observation method according to claim 8, wherein the charged particle beam device includes: an electrode arranged in a vicinity of the second insulating layer of the sample chamber; and a bias power supply that applies a predetermined bias voltage to the conductive layer of the sample chamber with the electrode serving as a reference potential, and the amplifier amplifies the current that flows through the electrode as the conductive layer of the sample chamber is irradiated with the charged particle beam, converts the amplified result into a voltage signal and outputs the converted result as the measurement signal.

10. The sample observation method according to claim 8, further comprising storing, in association with each other, the image data and/or the corrected image data and the information on the deconvolution filter used when acquiring the image data.

11. The sample observation method according to claim 10, wherein the image data is moving image data, and the corrected image data is corrected moving image data, and the method includes storing, in association with each other, the moving image data and/or the corrected moving image data and information on a deconvolution filter used when acquiring the moving image data, which is time-synchronized with the moving image data or the corrected moving image data.

12. The sample observation method according to claim 8, wherein the sample includes a biological sample.

* * * * *